(12) United States Patent
Volkmann

(10) Patent No.: US 10,236,864 B2
(45) Date of Patent: Mar. 19, 2019

(54) BUS COUPLER FOR COUPLING FIELD DEVICES

(71) Applicant: Siemens Aktiengesellschaft, Munich (DE)

(72) Inventor: Hans Volkmann, Burgthann (DE)

(73) Assignee: Siemens Aktiengesellschaft, Munich (DE)

( * ) Notice: Subject to any disclaimer, the term of this patent is extended or adjusted under 35 U.S.C. 154(b) by 224 days.

(21) Appl. No.: 15/298,345

(22) Filed: Oct. 20, 2016

(65) Prior Publication Data

US 2017/0126209 A1 May 4, 2017

(30) Foreign Application Priority Data

Oct. 30, 2015 (EP) .................................... 15192363

(51) Int. Cl.
*H02H 9/00* (2006.01)
*G05B 19/042* (2006.01)
*H03H 11/28* (2006.01)
*H04L 25/02* (2006.01)

(52) U.S. Cl.
CPC ......... *H03H 11/28* (2013.01); *G05B 19/0425* (2013.01); *H02H 9/008* (2013.01); *H04L 25/0278* (2013.01); *G05B 2219/1134* (2013.01); *G05B 2219/21123* (2013.01)

(58) Field of Classification Search
CPC ..... H04L 12/40045; H04L 2012/40221; H04L 25/0278; H04L 12/40; G05B 2219/1134; G05B 2219/21123
See application file for complete search history.

(56) References Cited

U.S. PATENT DOCUMENTS

| 5,835,534 A | 11/1998 | Kogure | |
|---|---|---|---|
| 9,830,291 B2 * | 11/2017 | Seifried | ................. G06F 13/40 |
| 2001/0022714 A1 | 9/2001 | Graube | |
| 2011/0254365 A1 | 10/2011 | Volkmann | |
| 2016/0141955 A1 * | 5/2016 | Seifried | ................ H02M 3/156 |
| | | | 323/282 |

FOREIGN PATENT DOCUMENTS

EP          2 383 622 A1      11/2011

* cited by examiner

*Primary Examiner* — Ryan Johnson
(74) *Attorney, Agent, or Firm* — Cozen O'Connor

(57) ABSTRACT

A bus coupler for coupling field devices to a superordinate bus system includes an impedance converter arranged in a series circuit with a terminating resistor between a signal input and a field device output to enable a comprehensive diagnosis option separately for each transmission line and the connected field device, wherein the terminating resistor assumes the function of a line terminating resistor and a current limitation, and where a controllable reference voltage source enables the maximum output current to be defined and the output shut off.

10 Claims, 4 Drawing Sheets

BUS COUPLER FOR COUPLING FIELD DEVICES

BACKGROUND OF THE INVENTION

Field of the Invention

The present invention relates to bus couplers and, more particularly, to a bus coupler for coupling field devices to a superordinate bus system.

SUMMARY OF THE INVENTION

It is an object of the invention to provide bus coupler for coupling field devices to a superordinate bus system to enable a comprehensive diagnosis option separately for each transmission line and the connected field device.

This and other object and advantages are achieved in accordance with the invention by a bus coupler for coupling field devices to a superordinate bus system, comprising a bus connection for the superordinate bus system, a respective connection for each respective field device of a plurality of field devices, a main transmit-receive unit configured to transmit and receive telegrams on the superordinate bus system, and a respective transmit-receive unit configured to communicate with a respective field device of the plurality of field devices, where the respective transmit-receive unit has a signal input for telegrams from the superordinate bus system, which is connected to the main transmit-receive unit, a field device output for the connection of the field devices, by which the telegrams are sent from the main transmit-receive unit to the field devices, and a receive signal connection by which the telegrams are forwarded from the field devices to the main transmit-receive unit, and a control input.

In accordance with the invention, the respective transmit-receive unit is configured such that the signal input is connected to a first input of an impedance converter, a second input of the impedance converter is connected to a controllable reference means, an output of the impedance converter is connected to a terminating resistor in a series circuit at the field device output, where a measuring means for determining a voltage drop is connected to the terminating resistor and the measuring means is connected to the reference means. Advantageously, the terminating resistor simultaneously forms a terminating resistor with an impedance of the transmission medium, i.e., the impedance of a piece of cable to the field device and a current-limiting resistor, such as is required for bus couplers used in explosion protection areas.

In a further embodiment, the bus coupler includes a control facility, which is configured to adjust the reference means with respect to a reference voltage for the second input via the control input to reduce a current flow through the terminating resistor and thus to obtain a current limit for the field device output. By combining the terminating resistor comprising the terminating resistor and the current limitation, the reference voltage can advantageously be set by the control facility such that the current limit can be set or a complete shut-off of the field device output is also possible. If the field device is shut off, interference couplings can no longer have a disturbing impact.

It is now advantageously possible to dispense with an additional current-limiting resistor for devices that are used in explosion protection areas.

In a further embodiment, the bus coupler includes a switching means that is provided between the signal input and the first input of the impedance converter. Advantageously, the signal input for telegrams can now be interrupted. The switching means can be used to shut off the modulation of the main transmit-receive unit, which is advantageous, for instance, for an automatic address-based assignment of the field devices.

In a particularly advantageous embodiment, the impedance converter is configured as an operational amplifier and planned such that its output impedance approaches zero and its output thus forms a virtual ground point, as a result of which a receive telegram, which is sent from the associated field device, can reach the main transmit-receive unit by way of the receive signal connection.

With respect to a facilitated diagnosis, a diagnosis signal preparation means for detecting diagnosis signals of the field devices is connected to the receive signal connection and configured so as to forward the diagnosis signals to the control facility.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

According to the drawing, exemplary embodiments are shown for the bus coupler, in particular for the embodiment of the transmit-receive unit, in which.

DETAILED DESCRIPTION OF THE EXEMPLARY EMBODIMENTS

Figure 1:
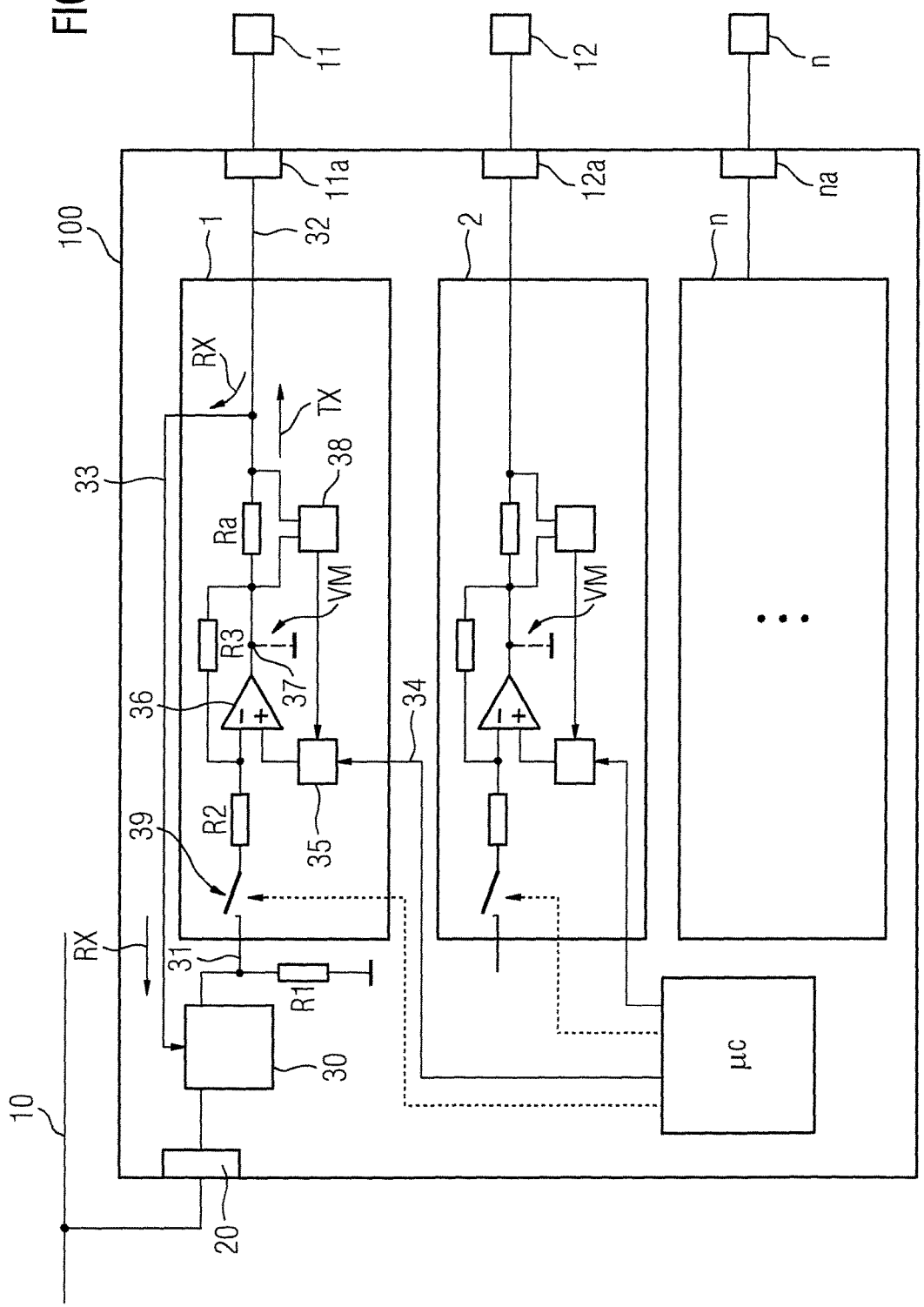
FIG. 1 is a schematic block diagram of a bus coupler with a number of connections for field devices.

With reference to FIG. 1, a bus coupler 100 for coupling field devices 11, 12, . . . , n to a superordinate bus system 10 is shown. The bus coupler 100 has a bus connection 20 in order to connect the bus coupler 100 to the superordinate bus system 10. In order to couple the field devices 11, . . . , n to the bus coupler 100, this has a first connection 11a for the first field device 11, a second connection 12a for the second field device 12 and an n'th connection na for the n'th field device n. A transmit-receive unit 1, 2, . . . , n is present for each connection 11a, 12a, . . . na. The transmit-receive units 1, . . . , n are similar in terms of configuration. As a result, only the first transmit-receive unit 1 is described in detail below.

The first transmit-receive unit 1 has a signal input 31 for telegrams of the superordinate bus system 10, which is connected to the main transmit-receive unit 30. For connection to the first field device 11, the first transmit-receive unit 1 has a field device output 32 for connection of the first field device 11. Telegrams TX, which are sent from the main transmit-receive unit 30 to the field devices 11, . . . , n, can be forwarded via this field device output 32.

For telegrams TX, which are forwarded from the field devices 11, . . . , n to the main transmit-receive unit 30, the first transmit-receive unit 1 has a receive signal connection 32. In order to engage in a controlled manner with the transmit-receive unit 1 via a control input 34, the bus coupler 100 has a control facility µc. The control facility µc can influence a controllable reference means 35 with respect to a reference voltage via the control input 34. In addition, the control facility µc is configured to influence a switching means 39.

The signal input 31 of the transmit-receive unit 1 is connected to a first input of an impedance converter 36, and a second input + of the impedance converter 36 is connected to the controllable reference means 35. An output 37 of the impedance converter 36 is connected to a terminating resistor Ra in a series circuit at the field device output 32. In order to determine a voltage drop on the terminating resistor Ra, a measuring means 38 is connected hereto, where the measuring means 38 is connected to the controllable reference means 35. The measuring means 38 continuously forwards its measured values to the reference means 35. As a result, the controllable reference means 35 can set or even entirely shut off the output current at the output 37 of the impedance converter 36 via a corresponding voltage assignment at the second input + of the impedance converter 36. A means for shutting off transmission lines to avoid interference couplings in non-connected field devices, for instance, is thus available.

The switching means 39 is arranged between the signal input 31 and the first input of the impedance converter 36. Telegrams from the main transmit-receive unit 30 can be entirely interrupted using the switching means 39. If the field device is virtually shut off by modulation, interference couplings can no longer have a disturbing impact on the transmission lines to the field devices. The switching means 39 can advantageously shut off the modulation but a supply voltage could nevertheless be retained for the field device, which is required, e.g., for an automatic address-based assignment of the field devices.

The impedance converter 36 is configured as an operational amplifier such that its output impedance approaches zero and the output 37 thus forms a virtual ground point VM. With the virtual ground point VM, it is possible for the terminating resistor Ra to form the standard terminating resistor of the transmission line, and receive telegrams RX, which are sent from the associated field device 11, can reach the main transmit-receive unit 30 via the receive signal connection 33. The impedance converter 36 experiences counter coupling via the resistor R2 and R3 in order to achieve an output impedance of zero. A first resistor R1 is arranged against ground at the signal input 31 on the main transmit-receive unit 30. The voltage over R1 is proportional here to the transmit signal Tx at the first connection 11a.

The control facility µc has a program that is configured to indicate a voltage value for the reference means 35 and is also configured to realize a shut-off of modulation signals to the first transmit-receive unit 1 via the switching means 39.

Figure 2:
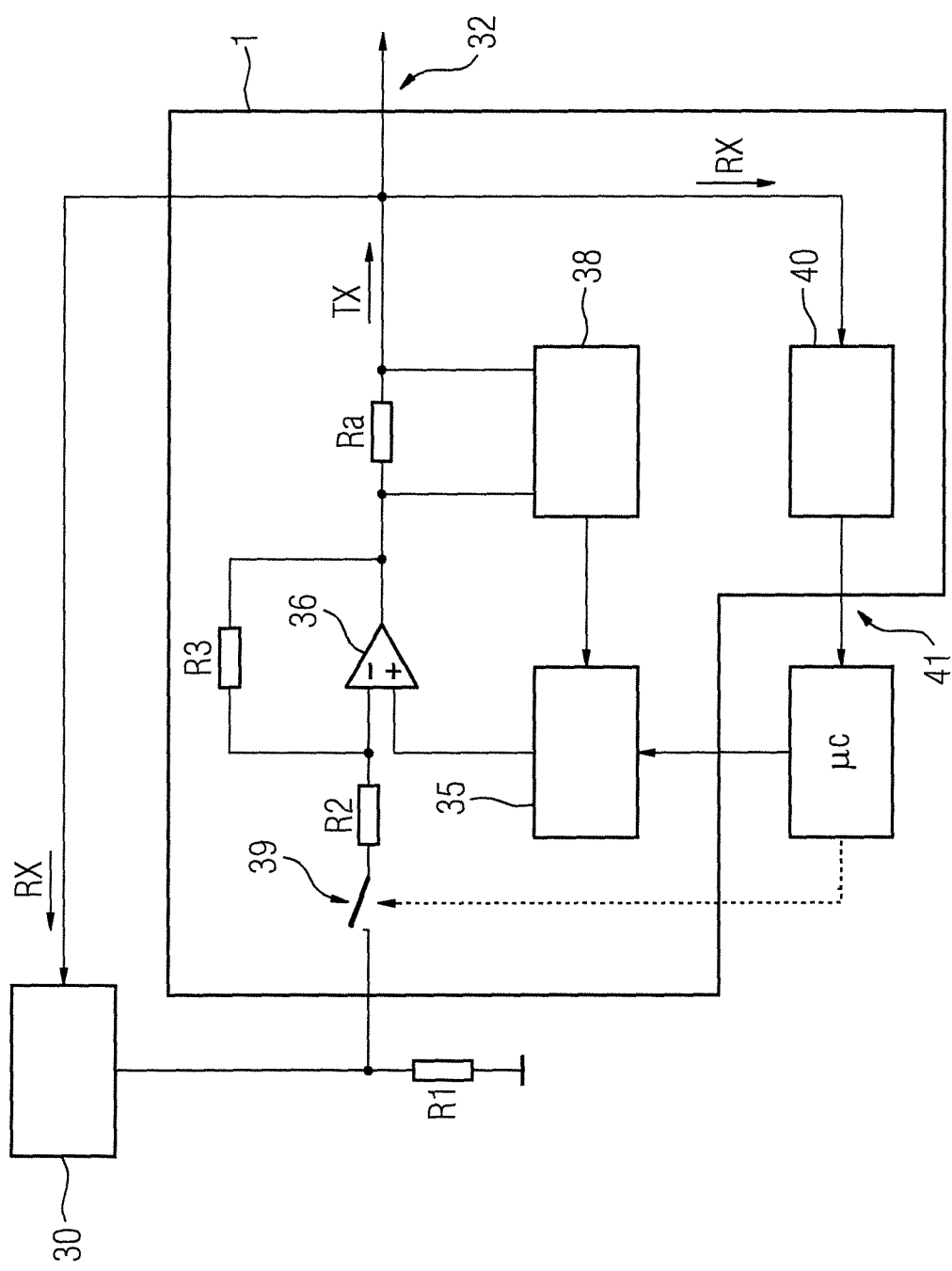
FIG. 2 is a schematic block diagram of a further development of a transmit-receive unit of FIG. 1.

With reference to FIG. 2, it is no longer the entire bus coupler of FIG. 1 which is shown, but instead still only an embodiment of the transmit-receive unit 1 with a corresponding control facility µc and a main transmit-receive unit 30. As shown in FIG. 2, a diagnosis signal preparation means 40 for detecting diagnosis signals of the field devices 11, . . . , n is now connected to the receive signal connection 33 in addition to the transmit-receive unit 1 disclosed in FIG. 1. The diagnosis signal preparation means 40 is configured to forward the diagnosis signals to the control facility µc.

Figure 3:
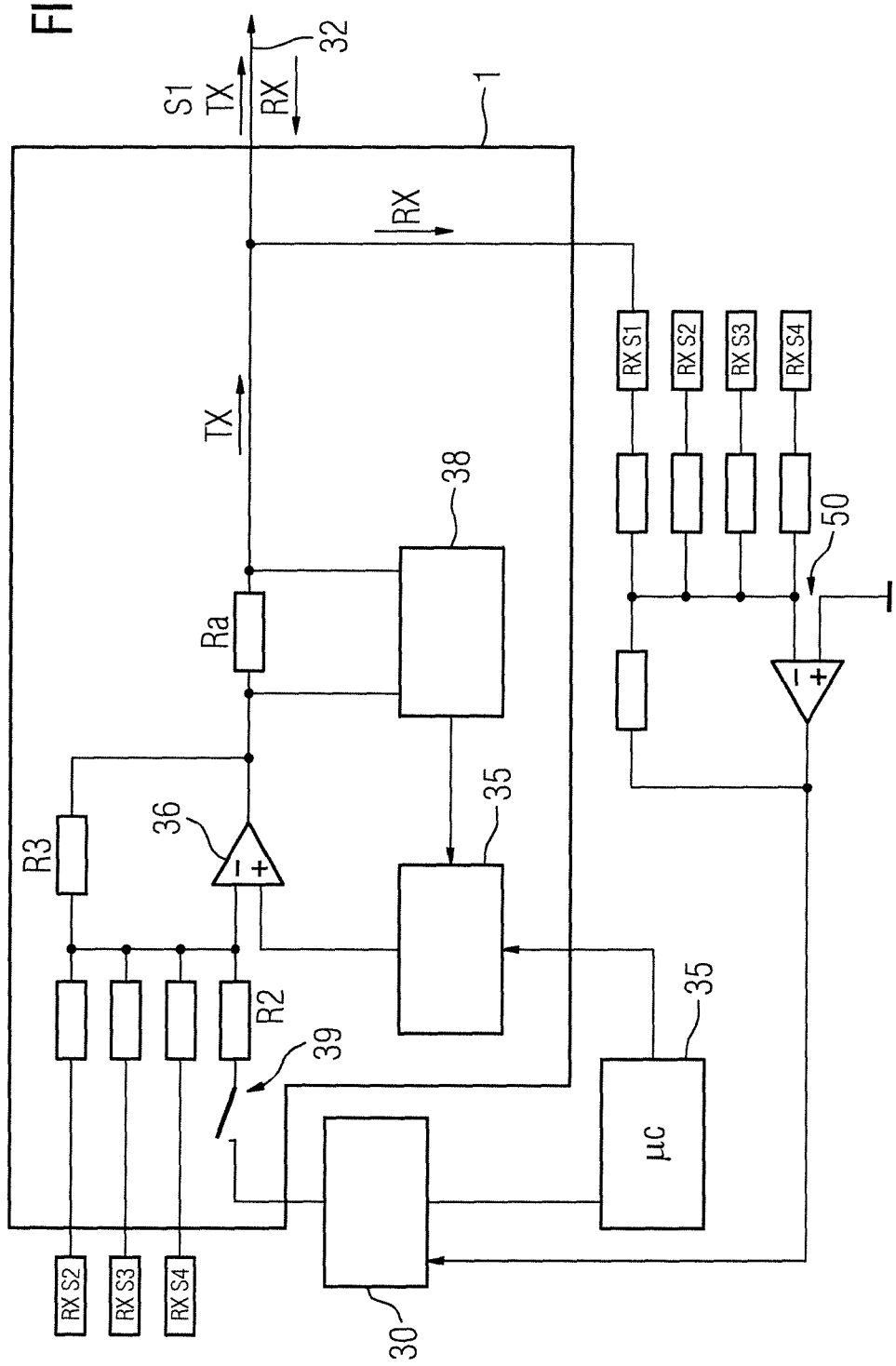
FIG. 3 is a schematic block diagram of an embodiment of a transmit-receive unit for use in an FF foundation (Field Bus Foundation)

FIG. 3 shows how, via the impedance converter 36, configured as an operational amplifier, bus signals or receive telegrams RX can be transmitted from other field devices, such as a second field device 12, a third field device 13 or a fourth field device 14 to the first field device 11. This type of transmission is provided, for instance, with the Field Bus Foundation (FF). The receive telegrams RX or receive signals of the remaining field devices are forwarded to the main transmit-receive unit 30 via a summing amplifier 50.

Figure 4:
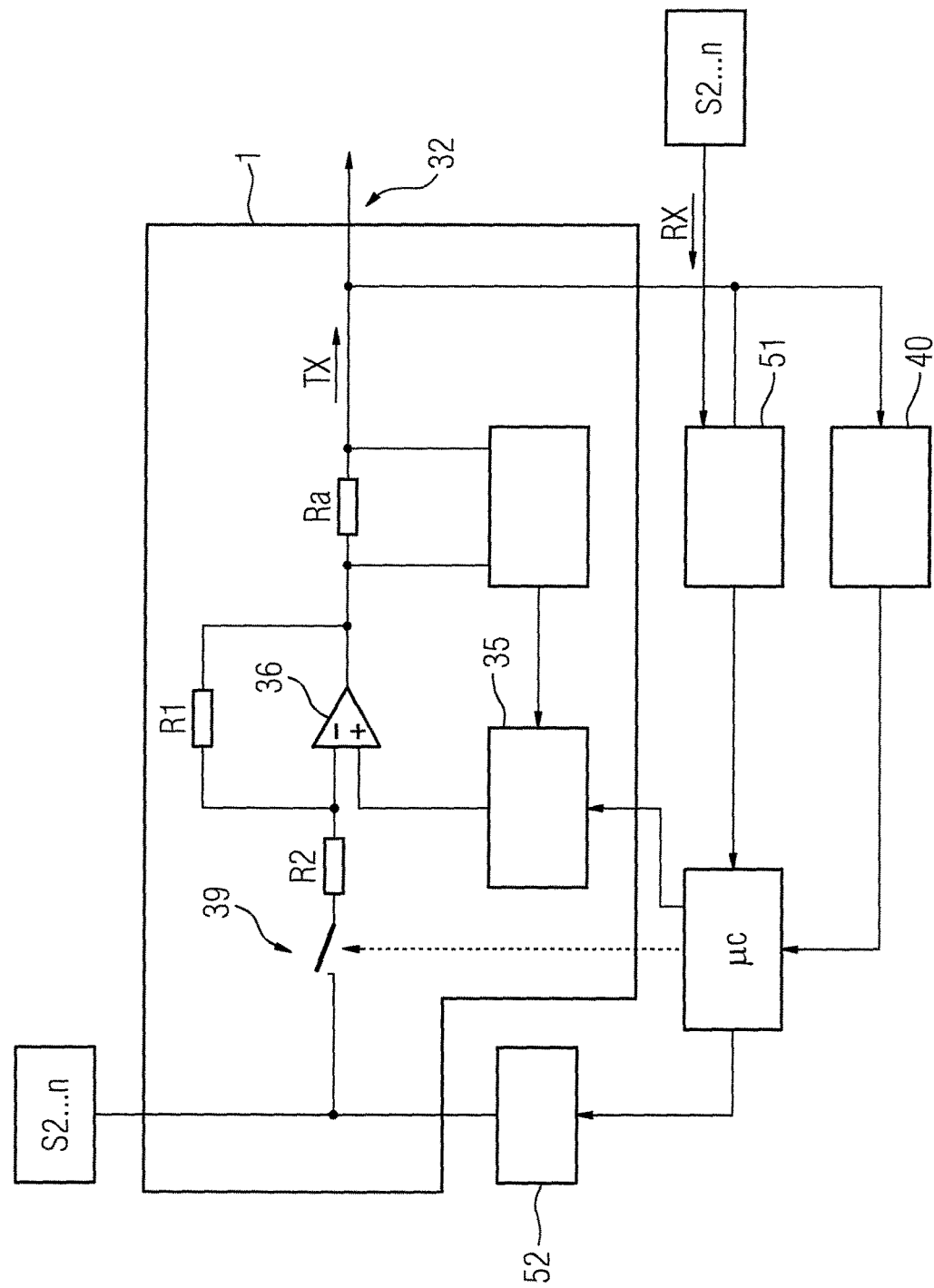
FIG. 4 is a schematic block diagram of an alternative embodiment of a bus coupler or a transmit-receive unit, where the function of the main transmit-receive unit is obtained by a combination of a voltage rise-limiting circuit and the correspondingly programmed control facility.

FIG. 4 shows a further example, where the main transmit-receive unit 30 was replaced by a receiver module 51 in connection with a voltage increase limitation 52, which is actuated by the control unit µc. All remaining field devices can be coupled with their receive telegrams RX to the receiver module 51.

Further ideas which are essential to the invention are as follows:

The field devices are generally assembled in ex-zones, which are not accessible during operation. There is therefore a need to detect as much diagnosis data as possible. With Profibus Automation (PA) or Field Bus Foundation (FF) bus systems, the field devices are connected via distributors. These distributors can be considered to be inventive bus couplers and, in accordance with the previous knowledge of the inventor, contain a current-limiting circuit, circuits for interference-free connection and diagnosis facilities for each outgoing track S1, S2, S3, S4 to each of the field devices.

A track S1, S2, S3, S4 is a piece of the field bus network or a plug-in cable between a distributor or a bus coupler and a field device. A modulation signal is prepared here jointly for all field devices. The problem here is that all field devices are connected and interferences from one device can be transmitted to the other devices. Diagnosis measured values, such as noise, jitter and/or signal level, cannot be assigned to the individual devices or only with complicated circuits. The invention counteracts this effect or phenomenon.

A terminating resistor Ra or a bus terminating resistor for the transmission line S1, S2, S3, S4 is now arranged in the distributor or in the bus coupler with typically 50 Ohms per track, and the field device without a terminating resistor is connected at the cable end to the field device.

The current modulation defined in the system becomes a voltage modulation at the terminating resistor Ra in the bus coupler 100. The advantageous use of an impedance converter configured as an operational amplifier and a series resistor, i.e., the terminating resistor Ra, for each transmission line enables this resistor to simultaneously form a current-limiting resistor for ex-protection areas and a terminating resistor for the cable. The separate supply and modulation for each track enables the following functions in conjunction with the controllable reference means: A voltage modulation, a bus terminating resistor for the field device, a current limitation, a current-limiting resistor for ex-protection areas, a summing amplifier for a communication connection between the field devices on the various transmission lines S1, S2, S3, S4, such as used in FF. A switching means for shutting off the transmission lines S1, S2, S3, S4 to avoid interference couplings in non-connected field devices and reducing the current in faulty cables by changing the reference voltage. With a diagnosis, the bus signals for signal preparation can be separately detected for each transmission line S1, S2, S3, S4 and fed to the control facility μc and evaluated.

To enable a comprehensive diagnosis option separately for each transmission line and the connected field device, in the case of a bus coupler (100) for coupling field devices (11, ..., n) to a superordinate bus system (10) an impedance converter (36) is arranged in a series circuit with a terminating resistor (Ra) between a signal input (31) and a field device output (32), where the terminating resistor (Ra) then assumes the function of a line terminating resistor and a current limitation. A controllable reference voltage source can define the maximum output current and shut down the output. A controllable reference voltage source enables the maximum output current to be defined and the output shut off.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those element steps which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A bus coupler for coupling field devices to a superordinate bus system, comprising:
    a connection for the superordinate bus system;
    a respective connection being provided for each respective field device of a plurality of field devices;
    a main transmit-receive unit configured to transmit and receive telegrams on the superordinate bus system;
    a respective transmit-receive unit configured to communicate with each respective field device of the plurality of field devices;
    wherein each respective transmit-receive unit includes:
        a signal input for telegrams of the superordinate bus system, which is connected to the main transmit-receive unit,
        a field device output for connection of the field devices, via which the telegrams are sent from the main transmit-receive unit to the field devices,
        a receive signal connection, via which the telegrams are forwarded from the plurality of field devices to the main transmit-receive unit, and
        a control input, each respective transmit-receive unit being configured such that the signal input is connected to a first input of an impedance converter, a second input of the impedance converter is connected to a controllable reference means, an output of the impedance converter is connected to a terminating resistor in a series circuit at the field device output, and a measuring means for determining a voltage drop is connected to the terminating resistor and the measuring means is connected to the reference means.

2. The bus coupler as claimed in claim 1, further comprising:
    a control facility configured to adjust the reference means with respect to a reference voltage for the second input via the control input to reduce a current flow through the terminating resistor and to realize a current limitation for the field device output.

3. The bus coupler as claimed in claim 2, further comprising:
    a switching means arranged between the signal input and the first input of the impedance converter.

4. The bus coupler as claimed in claim 2, wherein the impedance converter is configured as an operational amplifier and configured such that its output impedance approaches zero to form a virtual ground point; and
    wherein a receive telegram sent by an associated field device reaches the main transmit-receive unit via the receive signal connection.

5. The bus coupler as claimed in claim 2, further comprising:
    a diagnosis signal preparation means for detecting diagnosis signals of the field devices connected to the receive signal connection and configured to forward diagnosis signals to the control facility.

6. The bus coupler as claimed in claim 1, further comprising:
    a switching means arranged between the signal input and the first input of the impedance converter.

7. The bus coupler as claimed in claim 6, wherein the impedance converter is configured as an operational amplifier and configured such that its output impedance approaches zero to form a virtual ground point; and
    wherein a receive telegram sent by an associated field device reaches the main transmit-receive unit via the receive signal connection.

8. The bus coupler as claimed in claim 6, further comprising:
    a diagnosis signal preparation means for detecting diagnosis signals of the field devices connected to the receive signal connection and configured to forward diagnosis signals to a control facility.

9. The bus coupler as claimed in claim 1, wherein the impedance converter is configured as an operational amplifier and configured such that its output impedance approaches zero to form a virtual ground point; and
    wherein a receive telegram sent by an associated field device reaches the main transmit-receive unit via the receive signal connection.

10. The bus coupler as claimed in claim 9, further comprising:
    a diagnosis signal preparation means for detecting diagnosis signals of the field devices connected to the receive signal connection and configured to forward diagnosis signals to a control facility.

* * * * *